US010914785B2

(12) United States Patent
Chen et al.

(10) Patent No.: US 10,914,785 B2
(45) Date of Patent: Feb. 9, 2021

(54) TESTING METHOD AND TESTING SYSTEM

(71) Applicant: Realtek Semiconductor Corporation, Hsinchu (TW)

(72) Inventors: Chihtung Chen, San Diego, CA (US); Hsing-Han Tseng, Hsinchu (TW); Yi-Te Yeh, Hsinchu County (TW); Yung-Jen Chen, Zhubei (TW); Te-Ming Kuo, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/524,304

(22) Filed: Jul. 29, 2019

(65) Prior Publication Data
US 2020/0150176 A1 May 14, 2020

Related U.S. Application Data

(63) Continuation-in-part of application No. 16/188,699, filed on Nov. 13, 2018, now Pat. No. 10,598,730.

(51) Int. Cl.
G01R 31/3177 (2006.01)
G01R 31/3185 (2006.01)
G01R 31/3181 (2006.01)
G06F 11/26 (2006.01)

(52) U.S. Cl.
CPC .................. *G01R 31/3177* (2013.01)

(58) Field of Classification Search
None
See application file for complete search history.

(56) References Cited

U.S. PATENT DOCUMENTS

| 5,105,374 | A | 4/1992 | Yoshida |
| 5,604,895 | A | 2/1997 | Raimi |
| 5,724,504 | A | 3/1998 | Aharon et al. |
| 6,631,344 | B1 | 10/2003 | Kapur et al. |
| 6,985,012 | B2* | 1/2006 | Or-Bach ............... G06F 30/34 326/41 |
| 7,068,070 | B2* | 6/2006 | Or-Bach ............... H01L 27/118 326/38 |
| 7,373,621 | B1 | 5/2008 | Dastidar |
| 7,539,957 | B1 | 5/2009 | Nagarandal |
| 7,562,274 | B2 | 7/2009 | Chorn et al. |
| 9,529,697 | B1 | 12/2016 | Aldrich et al. |
| 10,496,771 | B2* | 12/2019 | Iwata ............... G01R 31/31856 |
| 2018/0300434 | A1 | 10/2018 | Hu et al. |

FOREIGN PATENT DOCUMENTS

CN 105988076 A 10/2016

* cited by examiner

*Primary Examiner* — Phung M Chung
(74) *Attorney, Agent, or Firm* — Locke Lord LLP; Tim Tingkang Xia, Esq.

(57) ABSTRACT

The present disclosure provides a testing method and a testing system. The testing method is performed by at least one processor and includes the following operations: converting a circuit data of a scan test to a program, in which the program is configured to observe an untested part of a circuitry that is unable to be tested in the scan test; generating a waveform data associated with the untested part; generating a look-up table according to the program and a netlist file, in which the netlist file indicates the circuitry; and testing the untested part of the circuitry according to the waveform data and the look-up table.

20 Claims, 2 Drawing Sheets

TESTING METHOD AND TESTING SYSTEM

CROSS-REFERENCE TO RELATED APPLICATION

This application is a continuation-in-part of U.S. application Ser. No. 16/188,699, filed on Nov. 13, 2018, and the entirety of which is incorporated by reference herein in their entireties.

BACKGROUND

Technical Field

The disclosure relates to a testing method and a testing system. More particularly, the disclosure relates to a testing method and a testing system for integrated circuits.

Description of Related Art

There are various methods for testing integrated circuits for years, however, the procedures nowadays for testing integrated circuits cost a large amount of time in evaluating the defect device. Accordingly, the overall manufacturing process will be procrastinated, and the efficiency of developing chips is decreased.

SUMMARY

Some aspects of the present disclosure are to provide a testing method and a testing system. The testing method includes the following steps: converting a circuit data of a scan test to a program, in which the program is configured to observe an untested part of a circuitry that is unable to be tested in the scan test; generating a waveform data associated with the untested part; generating a look-up table according to the program and a netlist file, in which the netlist file indicates the circuitry; and testing the untested part of the circuitry according to the waveform data and the look-up table.

Some aspects of the present disclosure are to provide a testing system that includes a memory and a processor. The memory is configured to store computer program codes. The processor is configured to execute the program codes to: convert a circuit data of a scan test to a program, in which the program is configured to observe an untested part of a circuitry that is unable to be tested in the scan test; generate a waveform data associated with the untested part; generate a look-up table according to the program and a netlist file, in which the netlist file indicates the circuitry; and test the untested part of the circuitry according to the waveform data and the look-up table.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

In this document, the term "circuitry" may indicate a system formed with one or more circuits. The term "circuit" may indicate an object, which is formed with one or more transistors and/or one or more active/passive elements based on a specific arrangement, for processing signals.

Figure 1:
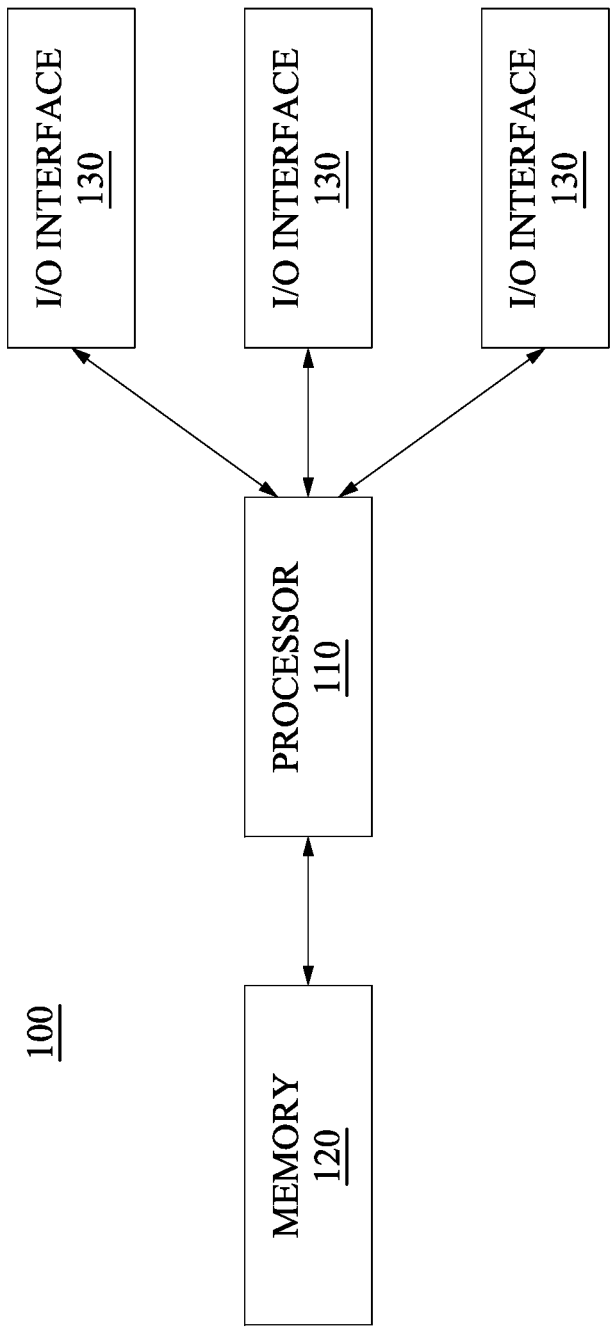
FIG. 1 is a schematic diagram of a testing system, according to some embodiments of the present disclosure.

Reference is made to FIG. 1. FIG. 1 is a schematic diagram of a testing system 100 according to some embodiments of the present disclosure. As shown in FIG. 1, the testing system 100 includes a processor 110, a memory 120, and input/output (I/O) interfaces 130. The processor 110 is coupled to the memory 120 and the I/O interfaces 130. In various embodiments, the processor 110 may be implemented with at least one processor circuit, a central processing unit (CPU), an application specific integrated circuit (ASIC), a multi-processor, a distributed processing system, or a suitable processing circuitry. Various circuits or units to implement the processor 110 are within the contemplated scope of the present disclosure.

The memory 120 stores at least one program code for testing integrated circuits. For illustration, the memory 120 stores at least one program code encoded with a set of instructions for testing or verifying functions of integrated circuits. The processor 110 may execute the at least one program code stored in the memory 120, and the operations corresponding to testing or verifying functions of the integrated circuits are able to be automatically performed. For illustration, the memory 120 stores executable instructions for performing operations including, for example, operations illustrated in FIG. 2.

The I/O interfaces 130 receive inputs or commands (not shown) from various control devices, which, for example, are operated by a circuit designer or a testing engineer. Accordingly, the testing system 100 can be controlled by the inputs or commands received from the I/O interfaces 130.

In some embodiments, the testing system 100 is configured to execute circuit test for a circuitry (not shown). The circuitry can include a plurality of scan chain circuits and a plurality of logic circuits. The scan chain circuits operate in a scan mode in response to a scan enable signal and various testing patterns TP, in order to perform a scan test for the logic circuits.

Figure 2:
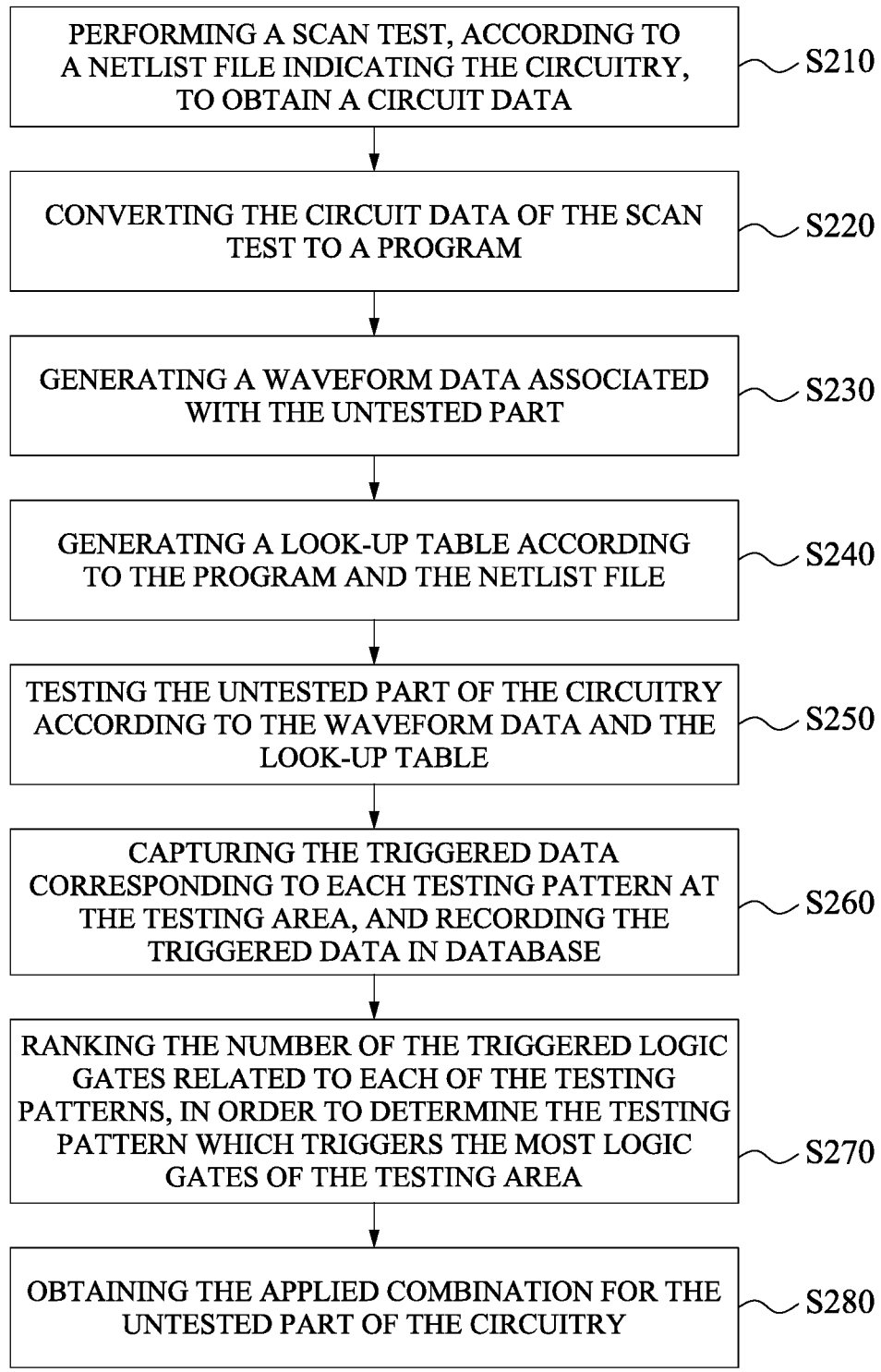
FIG. 2 is a flow chart of a testing method, according to some embodiments of the present disclosure.

Reference is made to FIG. 2. FIG. 2 is a flow chart of a testing method according to some embodiments of the present disclosure. In some embodiments, the testing method in FIG. 2 is suitable for the testing system 100 of FIG. 1. For ease of understanding, the testing method is described below with reference to FIG. 1.

In operation S210, a scan test is performed, according to a netlist file indicating the circuitry, to obtain a circuit data.

In some embodiments, in response to a command and the netlist file, the processor 110 executes the testing tool to perform the scan test on the circuitry. After the scan test is performed, the processor 110 may output a summary report of the scan test, and may store the same into the memory 120. The summary report includes information about which part of the circuitry is unable to be tested by the scan test (hereinafter referred to as "untested part of the circuitry"). For example, the circuitry includes a plurality of logic gates (such as 2000 gates), and the untested part indicates the logic gates which are unable to be tested. The number of gates is counted, such as 650 gates, after scan testing.

In some embodiments, the command and/or the netlist file can be transmitted from the I/O interfaces 130.

In operation S220, the circuit data of the scan test is converted to a program. The program is configured to observe an untested part of the circuitry. The program includes a plurality of region programs ASS.

In some embodiments, the processor 110 captures functions of the circuit data in the untested part and divides the untested part into a plurality of regions to be tested. For example, when logic gates in the untested part belong to the circuit region of graphic processing, the logic gates and the associated circuits are classified as the same region to be tested. Similarly, in the untested part, the processor 110 can group parts of the circuit data with the same or similar function in the untested part into a same region to be tested. In some embodiments, the untested part includes a plurality of regions to be tested, and each of regions to be tested corresponds to a circuit function.

The processor 110 selects a testing area from the regions to be tested. For example, the processor 110 selects the part of graphic processing from the regions to be tested as the testing area when preparing to detect the circuit associated with graphic processing.

Further, the processor 110 converts the circuit data of the testing area to the region programs ASS. In some embodiments, the processor 110 converts the circuit data of the testing area by a hardware program convert tool, in order to obtain the region program ASS. The region program ASS can be, but not limited to, programs configured to detect whether the untested circuit signals are triggered or not. The region program ASS is configured to observe the testing area in the untested part of the circuitry.

In operation S230, the processor 110 generates a waveform data associated with the untested part.

In some embodiments, the processor 110 operates a simulation tool to execute the testing patterns for the untested part, to generate the waveform data corresponding to each of the testing patterns. In another embodiment, the processor 110 operates the simulation tool to execute the testing patterns only in the testing area selected from the untested part. For example, the processor 110 executes the plurality of testing patterns respectively in the testing area, to generate a fast signal data base (FSDB) waveform of circuits in the testing area. Therefore, the processor 110 will obtain a plurality of waveform data corresponding to the testing patterns and store the waveform data in the memory 120. The simulation tool can be, but not limited to, the register transfer level (RTL) simulation tool.

In operation S240, the processor 110 generates a look-up table according to the program and the netlist file.

In some embodiments, the processor 110 generates a register list according to the circuitry information of the netlist file and the region program ASS of the selected testing area. For example, the processor 110 finds logic gates related to the region program ASS by the circuitry information of the netlist file and the region program ASS, and records the logic gates in a logic gate list. The logic gates can be, but not limited to, the registers or other electronic components. In some embodiments, the logic gate list includes a plurality of interested logic gates in the testing area of the circuitry.

In some embodiments, the RTL file is stored in the memory 120. The RTL file records data such as description data of logic gates in the circuitry.

Further, the processor 110 generates the look-up table according to the interested logic gates of the logic gate list and the description data of RTL file. In some embodiments, the look-up table includes the mapping information between the register transfer level data and the netlist file. For example, the look-up table records the mapping from the description data of each of the interested logic gates to the corresponding circuit data.

In operation S250, the processor 110 tests the untested part of the circuitry according to the waveform data and the look-up table.

In some embodiments, the description data of the interested logic gates in the testing area is searched by the processor 110 in the look-up table, such that the circuit data is obtained. The interested logic gates is obtained according to the circuit data and the netlist file. Then, the processor 110 inputs the waveform data into the terminals of each interested logic gates, in order to determine whether the interested logic gates are triggered by the waveform data corresponding to the testing pattern.

In another embodiment, the processor 110 updates the triggered information of the interested logic gates to the region program ASS corresponding to the testing area. For example, there are 650 un-triggered logic gates in the testing area, and there are 149 logic gates triggered and 501 logic gates un-triggered after the processor 110 inputs the waveform data. Therefore, the processor 110 records the altered information in the region program ASS.

In operation S260, the processor 110 captures the triggered data corresponding to each testing pattern in the testing area, and records the triggered data in a database. In some embodiments, the database records the number of triggered logic gates in the testing area and the applied testing patterns. In another embodiment, the processor 110 calculates the untriggered-gate ratio as the number of the untriggered logic gates related to the testing patterns over the total logic gates in the testing area. Therefore, the ratio of gates triggered by each of the testing patterns can be obtained.

In operation S270, the processor 110 ranks the number of the triggered logic gates related to each of the testing patterns, in order to determine the testing pattern which triggers the most logic gates of the testing area.

Reference is made to table 1, and table 1 represents the triggering data for one testing area to be tested. As shown in table 1, the testing patterns TP1-TP5 are configured to be executed for testing the same testing area. The processor 110 records the number of the triggered logic gates in the testing area, and calculates the triggered-gate ratio. In table 1, the triggered ratio corresponding to the testing pattern TP4 is the highest. Hence, the testing pattern TP4 is selected as one of a pattern set configured to testing the untested part. In some embodiments, the pattern set is also called an applied combination.

TABLE 1 triggered data of the testing area
Number of circuits in the testing area: 650

| Testing Pattern | Number of triggered circuits | Triggered ratio |
| --- | --- | --- |
| TP1 | 149 | 23% |
| TP2 | 192 | 30% |
| TP3 | 183 | 28% |
| TP4 | 204 | 31% |
| TP5 | 169 | 26% |

On the other hand, the ratio related to the testing pattern TP1 is the lowest. Hence, the testing pattern TP1 is the most inefficient pattern to trigger the gates in the testing area. However, the testing pattern TP1 may be the most efficient pattern to trigger another testing area in other embodiments, the testing pattern TP1 may be selected in the applied combination while testing the another testing area.

In some embodiments, the testing method of the present disclosure executes the operations S210-S270 repetitively for all the regions to be tested, which are illustrated above.

In some embodiments, the testing method of the present disclosure executes the operations S230-S270 repetitively for all the regions to be tested, which are illustrated above.

In operation S280, the processor 110 obtains the applied combination for the untested part of the circuitry.

In some embodiments, the processor 110 executes the testing method, and obtains the testing patterns which are related to the highest triggered ratios of the regions to be tested, and obtains the applied combination for the untested part. The applied combination includes the testing patterns having the highest triggered ratios for the regions to be tested respectively. For example, when there are 10 regions to be tested in the untested part, the processor 110 executes the testing method. After finishing the testing method, the processor 110 obtains the testing patterns for the 10 regions to be tested, and each of the testing patterns is related to the highest triggering ratio. Hence, the 10 testing patterns are configured to be the applied combination for the untested part.

Reference is made to table 2, and table 2 represents executing time and percentage of time reduction by the testing method in the present disclosure. In one embodiment, the time reduction is calculated based on the testing method provided by the testing method of the present disclosure and another testing method. The executing time of the testing method in the present disclosure is 9402 seconds while the testing pattern TP1 is used. Compared to another method which costs 20195 seconds, the executing time is decreased by 53.4%. It should be noted that the executing times in table 2 represent the total executing time for all the regions to be tested of the untested part. For example, the total execution time for all the regions to be tested for which the testing pattern TP1 is used is 9402 seconds.

TABLE 2 executing time and percentage of time reduction

| Testing Pattern | Executing time of another method (seconds) | Executing time of the present disclosure (seconds) | Percentage of time reduction |
| --- | --- | --- | --- |
| TP1 | 20195 | 9402 | −53.4% |
| TP2 | 18446 | 1604 | −91.3% |
| TP3 | 38882 | 3565 | −90.8% |
| TP4 | 17349 | 2470 | −85.8% |
| TP5 | 16339 | 2325 | −85.8% |
| Total time | 111211 | 19366 | −82.6% |

In some embodiments, the testing method is implemented as a testing tool stored in a non-transitory computer-readable medium. In other words, the testing method may be implemented with hardware (e.g., the testing system 100), software, firmware, and the combination thereof. For illustration, if speed and accuracy are determined to be paramount, a hardware and/or a firmware vehicle is utilized. Alternatively, if flexibility is paramount, a software implementation is utilized. Various arrangements to implement the testing method are within the contemplated scope of the present disclosure.

As illustrated above, the testing system and testing method in the present disclosure divide the untested part of the circuitry into smaller regions to be tested by their functions, such that one of the regions to be tested is tested by the plurality of testing patterns at a time, in order to determine the testing pattern which has the highest triggering ratio. Therefore, because the size of the region to be tested at each set of procedures (such as operations S210-S270 or operations S230-270) is reduced, the time needed to determine the most suitable testing pattern is decreased, the total time to determine the applied combination for the entire untested part is also decreased, and the efficiency of testing integrated circuits is improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A testing method, performed by at least one processor, the method comprising:
converting a circuit data of a scan test to a program, wherein the program is configured to observe an untested part of a circuitry that is unable to be tested in the scan test;
generating a waveform data associated with the untested part;
generating a look-up table according to the program and a netlist file, wherein the netlist file indicates the circuitry; and
testing the untested part of the circuitry according to the waveform data and the look-up table.

2. The testing method of claim 1, wherein the untested part comprises a plurality of regions to be tested, wherein converting the circuit data of the scan test to the program comprises:
selecting a testing area from one of the regions to be tested; and
converting the circuit data associated with the testing area to a region program, wherein the region program is configured to observe the testing area in the untested part.

3. The testing method of claim 2, further comprising:
generating a logic gate list according to the circuitry corresponding to the netlist file and the region program, wherein the logic gate list comprises a plurality of interested logic gates in the circuitry.

4. The testing method of claim 3, wherein the step of generating the look-up table according to the program and the netlist file comprises:
generating the look-up table according to the interested logic gates in the logic gate list and a description data of the interested logic gates recorded in a register transfer level file.

5. The testing method of claim 4, wherein testing the untested part of the circuitry according to the waveform data and the look-up table comprises:
searching the description data corresponding to the interested logic gates in the look-up table to obtain the interested logic gates.

6. The testing method of claim 5, further comprising:
inputting the region waveform data into the obtained interested logic gates respectively, in order to test the testing area through the testing patterns.

7. The testing method of claim 6, further comprising:
recording a test result after testing the testing area, wherein the test result comprises states of the interested logic gates which are triggered by the testing patterns in the testing area.

8. The testing method of claim 7, further comprising:
analyzing the test result, and calculating ratios of the interested logic gates, triggered by the testing patterns, of all the interested logic gates in the testing area respectively.

9. The testing method of claim 8, further comprising:
setting an applied combination configured to test the untested part, and the applied combination comprises the testing patterns having the largest ratios associating regions to be tested respectively.

10. The testing method of claim 2, wherein the step of generating the waveform data associated with the untested part comprises:
executing a register transfer level simulation in the testing area according to a plurality of testing patterns to generate a plurality of region waveform data associated with the testing patterns respectively.

11. A testing system, comprising:
a memory configured to store program codes; and
a processor coupled to the memory, wherein the processor is configured to execute the program codes to:
convert a circuit data of a scan test to a program, wherein the program is configured to observe an untested part of a circuitry that is unable to be tested in the scan test;
generate a waveform data associated with the untested part;
generate a look-up table according to the program and a netlist file, wherein the netlist fife indicates the circuitry; and
test the untested part of the circuitry according to the waveform data and the look-up table.

12. The testing system of claim 11, wherein the untested part comprises a plurality of regions to be tested, and the processor is further configured to:
select a testing area from one of the regions to be tested; and
convert the circuit data associated with the testing area to a region program, wherein the region program is configured to observe the testing area in the untested part.

13. The testing system of claim 12, wherein the processor is further configured to execute a register transfer level simulation in the testing area according to a plurality of testing patterns to generate a plurality of region waveform data associated with the testing patterns respectively.

14. The testing system of claim 13, wherein the processor is further configured to generate a logic gate list according to the circuitry corresponding to the netlist file and the region program, wherein the logic gate list comprises a plurality of interested logic gates in the circuitry.

15. The testing system of claim 14, wherein the processor is further configured to generate the look-up table according to the interested logic gates in the logic gate list and a description data of the interested logic gates recorded in a register transfer level file.

16. The testing system of claim 15, wherein the processor is further configured to search the description data corresponding to the interested logic gates in the look-up table to obtain the interested logic gates.

17. The testing system of claim 16, wherein the processor is further configured to input the region waveform data into the obtained interested logic gates respectively, in order to test the testing area through the testing patterns.

18. The testing system of claim 17, wherein the processor is further configured to record a test result after testing the testing area, and the test result comprises states of the interested logic gates which are triggered by the testing patterns in the testing area.

19. The testing system of claim 18, wherein the processor is further configured to analyze the test result, and to calculate ratios of the interested logic gates, triggered by the testing patterns, of all the interested logic gates in the testing area respectively.

20. The testing system of claim 19, wherein the processor is further configured to set an applied combination configured to test the untested part, and the applied combination comprises the testing patterns having the largest ratios associating regions to be tested respectively.

* * * * *